US010444793B2

(12) United States Patent
Shibayama et al.

(10) Patent No.: US 10,444,793 B2
(45) Date of Patent: Oct. 15, 2019

(54) ELECTRIC DEVICE AND ELECTRONIC DEVICE SYSTEM

(71) Applicant: LENOVO (SINGAPORE) PTE. LTD., Singapore (SG)

(72) Inventors: Yoshiyuki Shibayama, Takasaki (JP); Yuta Tsuganezawa, Yokohama (JP); Eiji Shinohara, Kawasaki (JP)

(73) Assignee: LENOVO (SINGAPORE) PTE. LTD., Singapore (SG)

( * ) Notice: Subject to any disclaimer, the term of this patent is extended or adjusted under 35 U.S.C. 154(b) by 538 days.

(21) Appl. No.: 15/244,606

(22) Filed: Aug. 23, 2016

(65) Prior Publication Data
US 2017/0344059 A1    Nov. 30, 2017

(30) Foreign Application Priority Data
May 27, 2016  (JP) .................................. 2016-106119

(51) Int. Cl.
G06F 1/20    (2006.01)
H05K 7/20    (2006.01)
G06F 1/16    (2006.01)

(52) U.S. Cl.
CPC .......... *G06F 1/1632* (2013.01); *G06F 1/1616* (2013.01); *G06F 1/1679* (2013.01); *G06F 1/203* (2013.01); *H05K 7/2039* (2013.01); *H05K 7/20272* (2013.01); *G06F 2200/201* (2013.01)

(58) Field of Classification Search
CPC .... G06F 1/1632; G06F 1/1616; G06F 1/1679; G06F 1/203; G06F 2200/201; H05K 7/2039; H05K 7/2072; H05K 7/20272
See application file for complete search history.

(56) References Cited

U.S. PATENT DOCUMENTS

| 6,687,123 | B2 * | 2/2004 | Kitahara | ............... | G06F 1/1632 |
| | | | | | 165/121 |
| 2013/0148276 | A1 * | 6/2013 | Yu | ....................... | H04M 1/0237 |
| | | | | | 361/679.01 |

FOREIGN PATENT DOCUMENTS

JP          2014228928 A  * 12/2014

* cited by examiner

*Primary Examiner* — Dimary S Lopez Cruz
*Assistant Examiner* — Ingrid D Wright
(74) *Attorney, Agent, or Firm* — Shimokaji IP

(57) ABSTRACT

There is provided an electric device having such a structure that members are moved by a driving force of an electric motor. The electric device comprises: an electric motor; a driving member which receives a driving force from the electric motor to advance and retreat; a moving member pressed by the driving member to move; a stopper which restricts a moving range of the moving member; and a cushioning mechanism located on a pressing part of the driving member against the moving member or a pressure-receiving part of the moving member pressed by the pressing part configured to transmit a pressing force of the driving member to move the moving member before the movement of the moving member is restricted by the stopper, and to absorb the pressing force of the driving member after the movement of the moving member is restricted by the stopper.

13 Claims, 10 Drawing Sheets

ELECTRIC DEVICE AND ELECTRONIC DEVICE SYSTEM

FIELD OF THE INVENTION

The present invention relates to an electric device having such a structure that members are moved by a driving force of an electric motor.

BACKGROUND OF THE INVENTION

Conventionally, there have been electric devices, each having such a structure that members are moved by a driving force of an electric motor.

SUMMARY OF THE INVENTION

It is an object of the present invention to provide an electric device having such a structure that members are moved by a driving force of an electric motor.

An electric device according to the present disclosure includes: an electric motor; a driving member which receives a driving force of the electric motor to advance and retreat; a moving member pressed by the driving member to move; a stopper which restricts a moving range of the moving member; and a cushioning mechanism provided on a pressing part of the driving member that presses the moving member or a pressure-receiving part of the moving member pressed by the pressing part to transmit a pressing force of the driving member to the moving member so as to move the moving member before the movement of the moving member is restricted by the stopper, and to absorb the pressing force of the driving member after the movement of the moving member is restricted by the stopper.

According to the present invention, there is provided an electric device and an electronic device system configured to move members by a driving force of an electric motor.

DETAILED DESCRIPTION OF THE INVENTION

Figure 1:
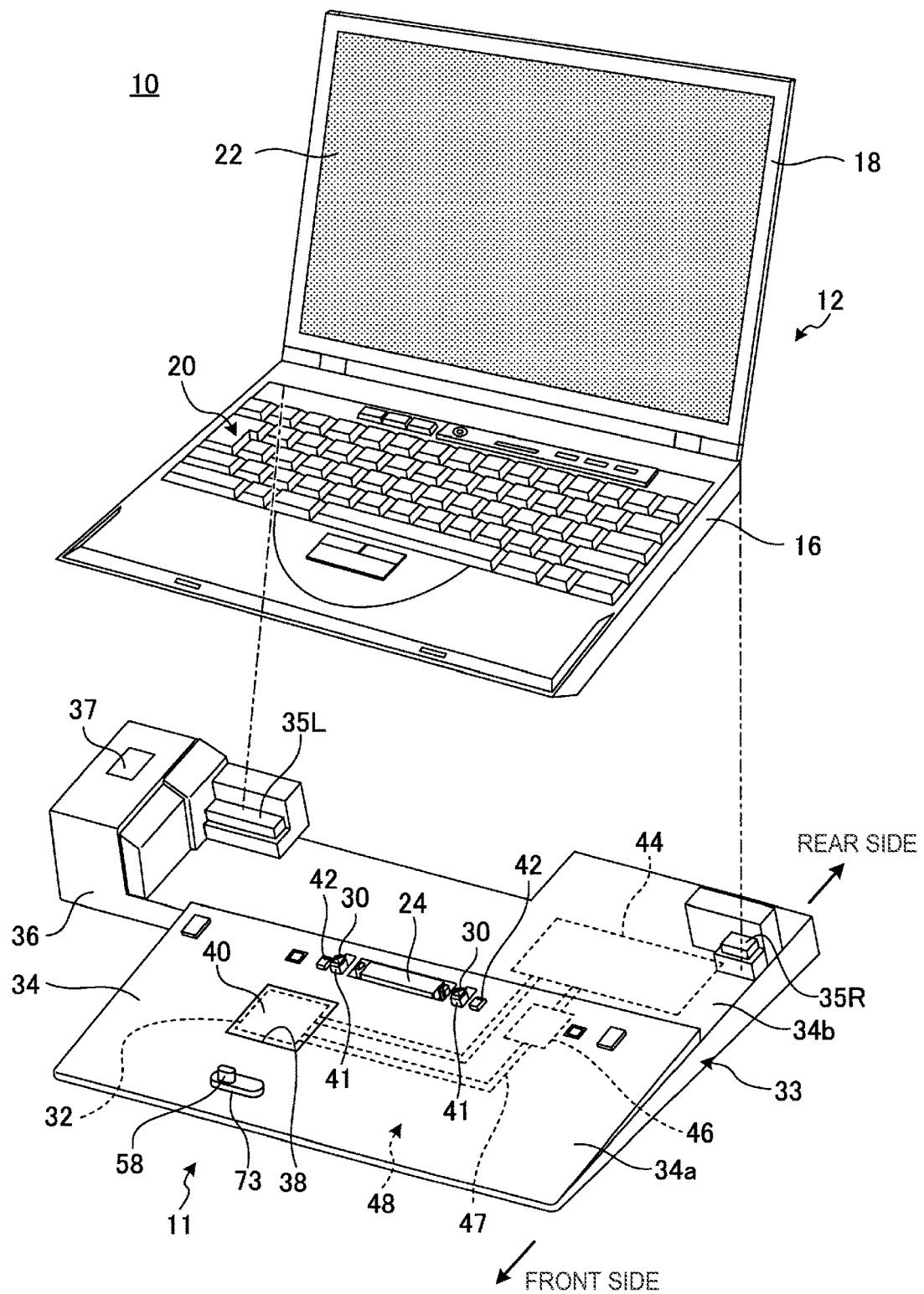
FIG. 1 is a configuration diagram of an electronic device system.
Figure 2:
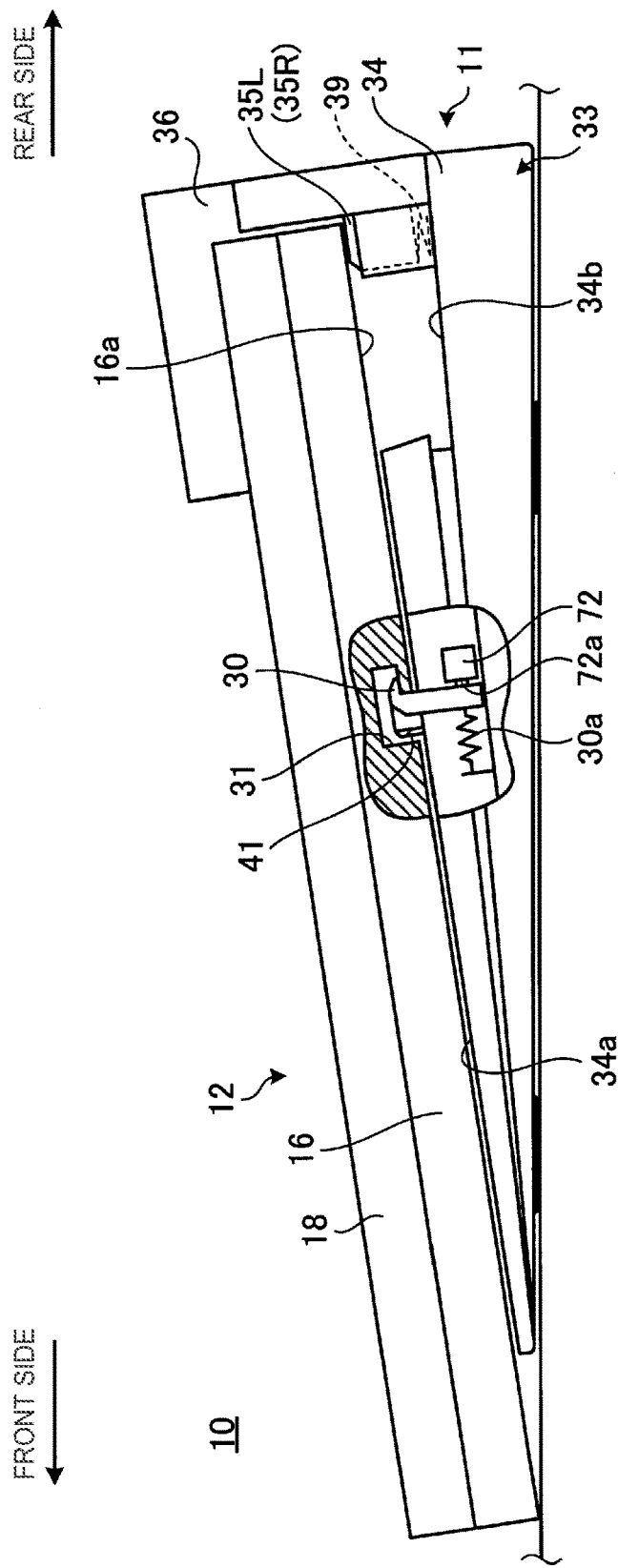
FIG. 2 is a partially sectional side view in a state where an electric device and a portable computing device illustrated in FIG. 1 are connected.
Figure 3:
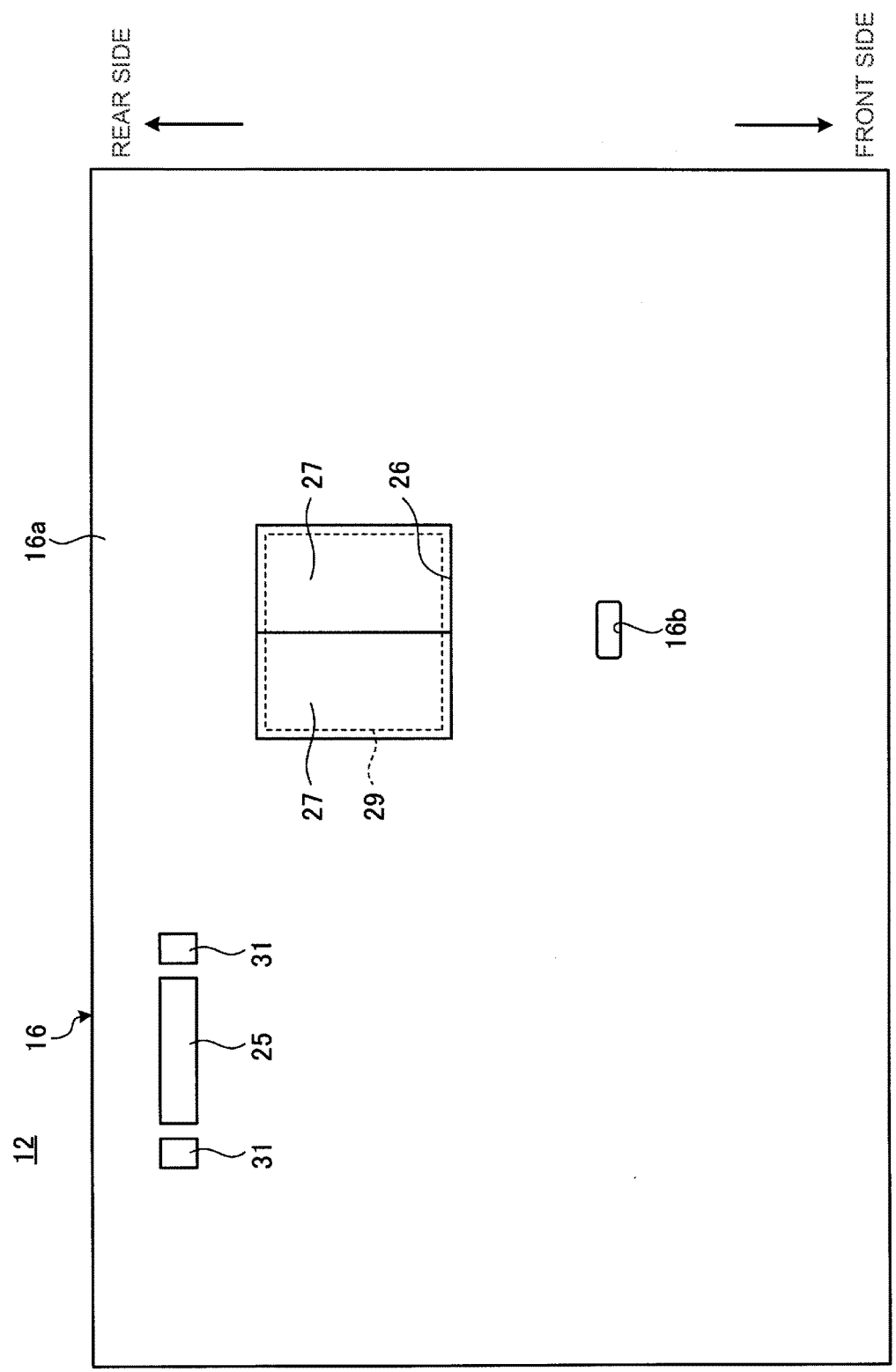
FIG. 3 is a bottom view schematically illustrating the structure of a bottom face of the portable computing device illustrated in FIG. 1.

FIG. 1 is a configuration diagram of an electronic device system 10 according to the present disclosure, which is a perspective view in a state where an electric device 11 and a portable computing device 12 are separated from each other. FIG. 2 is a partially sectional side view in a state where the electric device 11 and the portable computing device 12 illustrated in FIG. 1 are connected. FIG. 3 is a bottom view schematically illustrating the structure of a bottom face 16a of the portable computing device 12 illustrated in FIG. 1.

The present disclosure exemplifies the electronic device system 10 in which a laptop PC as an example of the portable computing device 12 is connected to the electric device 11 as a cooling device to reinforce the cooling function of the portable computing device 12. The electric device 11 may have a function to extend/reinforce a processing function of the portable computing device 12, a power supply function, and a connection function to a peripheral device or a network. The portable computing device 12 may be any device other than the laptop PC, that is, for example, it may be a tablet PC, a smartphone, or the like.

First, the general configuration of the electronic device system 10 will be described.

As illustrated in FIG. 1, the portable computing device 12 has a clamshell type structure in which a display chassis 18 is coupled openably and closably to a main body chassis 16. A keyboard 20 is provided on the top face of the main body chassis 16. A display 22 is provided on the front face of the display chassis 18.

As illustrated in FIG. 2 and FIG. 3, a connector 25 electrically connected to a connector 24 of the electric device 11, a rectangular opening 26, and a pair of engaging holes 31 are provided in the bottom face 16a of the main body chassis 16. The opening 26 is covered with a shutter member 27 openably and closably. The shutter member 27 is, for example, of a sliding double-opening structure. A heat-radiating side heat sink 29 openably and closably covered with the shutter member 27 is arranged inside the opening 26. The engaging holes 31 can be engaged with engaging levers 30 protruding from the side of the electric device 11.

The connector 25 is connected to an unillustrated substrate housed inside the main body chassis 16. The heat-radiating side heat sink 29 comes into contact with a heat-receiving side heat sink 32 on the side of the electric device 11 to extend the cooling function of the portable computing device 12. When the heat-radiating side heat sink 29 and the heat-receiving side heat sink 32 are brought into contact with and thermally connected to each other, heat generated inside the portable computing device 12 can be transmitted to the electric device 11 to radiate the heat to the outside. The shutter member 27 is to prevent the heat-radiating side heat sink 29 becoming a high temperature from being always exposed on the bottom face 16a of the portable computing device 12.

As illustrated in FIG. 1 and FIG. 2, the electric device 11 is used in a state where the main body chassis 16 of the portable computing device 12 is placed thereon. The electric device 11 is configured such that a PC placing part 34 and an operation part 36 are provided on a device chassis 33 formed out of a synthetic resin material or a metallic material.

The PC placing part 34 is a box body having a top face large enough to place the portable computing device 12 thereon. The PC placing part 34 has a placing face 34a and a flank face 34b. The placing face 34a is so inclined that the height will be increased gradually from the front side to the rear side to form a surface on which the bottom face 16a of the portable computing device 12 is landed. The flank face 34b is formed to be one step lower than the rear side of the placing face 34a. The flank face 34b is a lower part provided to stay away from an unillustrated battery or the like when the battery or the like projects from the rear bottom face of the portable computing device 12.

Supporting members 35L and 35R are provided in rear right and left end portions of the flank face 34b, respectively. The supporting members 35L and 35R are cushioning members provided to support the rear end portions of the bottom face 16a of the portable computing device 12 to be movable up and down. Each of the supporting members 35L and 35R is biased in a rising direction by an elastic body 39 such as a coil spring. When being pressed by the weight of the portable computing device 12, the supporting member 35L, 35R falls against the biasing force of the elastic body 39 (see FIG. 2), while when being not given the weight of the portable computing device 12, the supporting member 35L, 35R rises (see FIG. 1).

The operation part 36 is a rectangular parallelepiped part having a height greater than that of the PC placing part 34. The operation part 36 is provided in a rear position of one side of the PC placing part 34 (one side of the flank face 34b). The operation part 36 has an eject button 37 and an unillustrated key insertion hole. The eject button 37 is an operation button operated when the portable computing device 12 connected to the electric device 11 is removed. The key insertion hole is an opening into which an unillustrated wire type lock key is inserted. When the lock key is inserted into the key insertion hole to perform a lock operation, an input operation to the eject button 37 is disabled. This prevents the portable computing device 12 from being removed from the electric device 11 to protect against the theft of the portable computing device 12.

The connector 24 and a shutter member 40 openably and closably covering an opening 38 formed in the placing face 34a are provided on the placing face 34a. The heat-receiving side heat sink 32 is arranged inside the opening and covered openably and closably with the shutter member 40.

The connector 24 is connected to an unillustrated substrate or the like housed inside the PC placing part 34 to protrude from the placing face 34a. The connector 24, which constitutes connection terminals of various extended functions provided in the electric device 11, is connected to the connector 25 provided on the bottom face 16a of the portable computing device 12. When the connector 25 is connected to the connector 24, the electric device 11 and the portable computing device 12 are electrically connected, and this enables the portable computing device 12 to use the various extended functions provided in the electric device 11.

The engaging levers 30 protrude from the right and left sides of the connector 24, respectively, and upper portions thereof are exposed on the placing face 34a. Each engaging lever 30 is biased by a lever spring 30a in a direction (rearward) of being engaged with each of the engaging holes 31. A guide post 41 having a U-shape in plan view to surround three sides, i.e., the front side and the right and left sides of the engaging lever 30 is formed to protrude. When the portable computing device 12 is connected to the electric device 11, the guide post 41 is inserted together with the engaging lever 30 into the engaging hole 31 on the side of the portable computing device 12 to serve as a positioning pin for positioning the portable computing device 12 with respect to the device chassis 33. Further, an eject member 42 is provided at the side of each guide post 41 on the placing face 34a, respectively. When the portable computing device 12 is removed from the electric device 11, the eject member 42 rises after the engaged state of the engaging lever 30 with the engaging hole 31 is released to push up the bottom face 16a of the portable computing device 12.

Next, a cooling structure of the portable computing device 12 by the electric device 11 will be specifically described.

Figure 4:
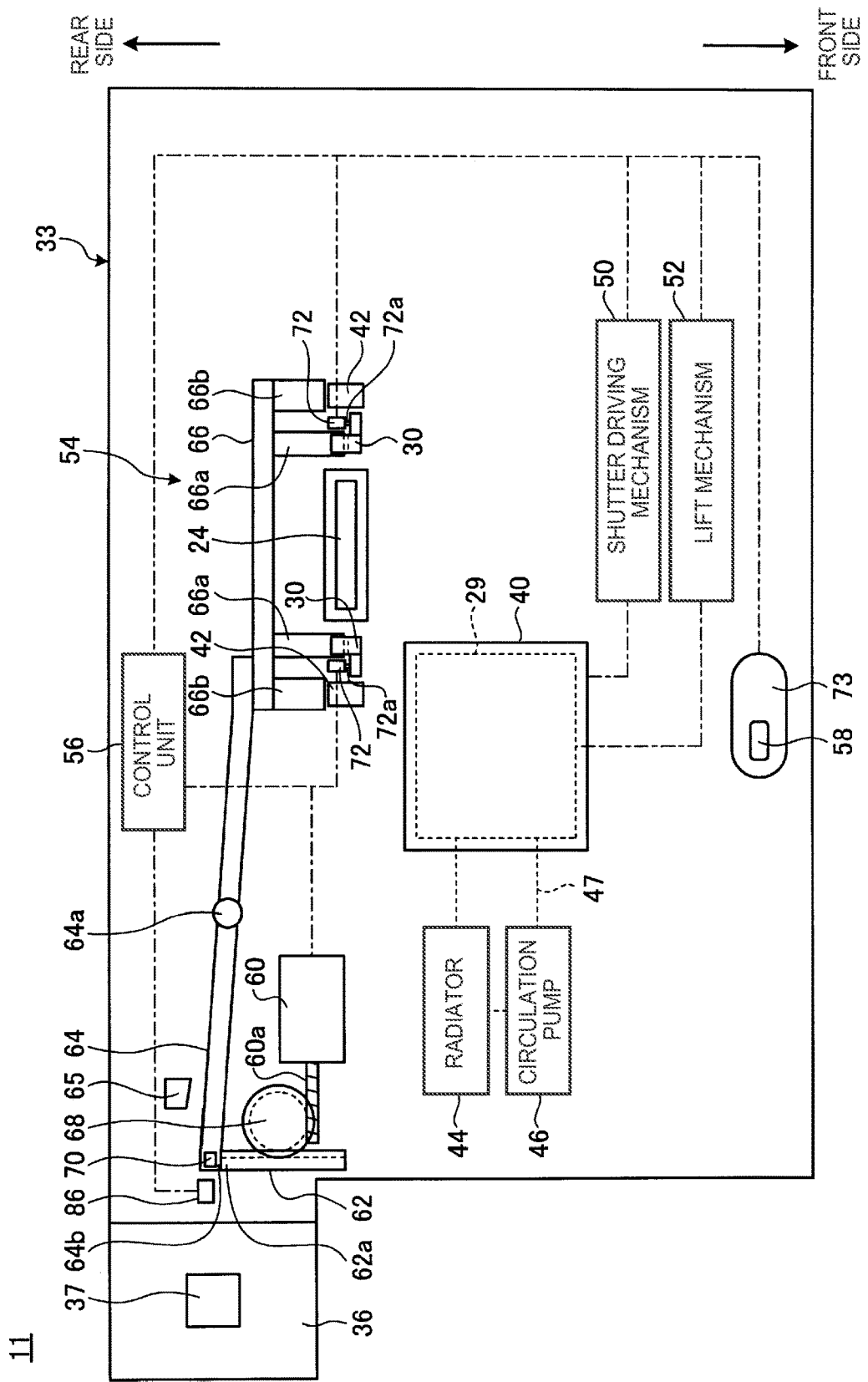
FIG. 4 is a plan view schematically illustrating an inner structure of the electric device.
Figure 5:
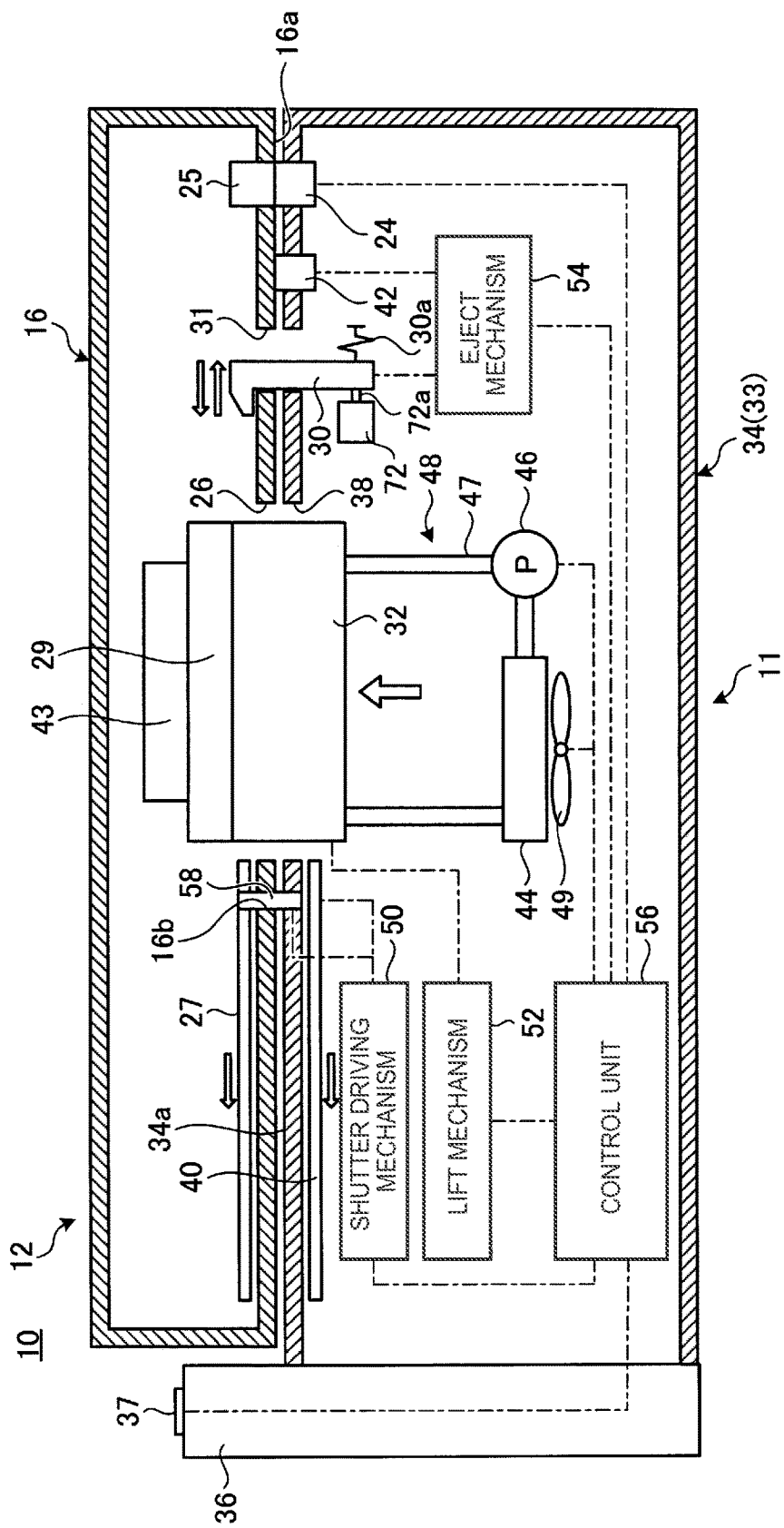
FIG. 5 is a side view schematically illustrating the inner structure when the electric device and the portable computing device are connected.

FIG. 4 is a plan view schematically illustrating an inner structure of the electric device 11. FIG. 5 is a side view schematically illustrating the inner structure when the electric device 11 and the portable computing device 12 are connected.

As illustrated in FIG. 3 and FIG. 5, the portable computing device 12 has, in the bottom face 16a, the heat-radiating side heat sink 29 provided openably and closably with the shutter member 27. The heat-radiating side heat sink 29 is a rectangular plate-like member made of a metallic material having high thermal conductivity such as copper or aluminium. The heat-radiating side heat sink 29 is thermally connected to a heating element 43 provided inside the main body chassis 16. The heating element 43 is an electronic component such as a CPU (Central Processing Unit) or a GPU (Graphics Processing Unit). Heat generated by the heating element 43 is transmitted efficiently to the heat-radiating side heat sink 29.

As illustrated in FIG. 1, FIG. 4, and FIG. 5, the electric device 11 includes a water-cooling unit 48 for circularly connecting the heat-receiving side heat sink 32, a radiator 44, and a circulation pump 46 through piping 47 to circulate cooling water.

The heat-receiving side heat sink 32 is a rectangular plate-like member made of a metallic material having high thermal conductivity such as copper or aluminium. Inlet piping 47 and outlet piping 47 are connected to the heat-receiving side heat sink 32 so that the cooling water will circulate in a cooling water circulating space with unillustrated fins arranged internally. This cooling water circulating space is formed inside of a thin lid that forms the top face of the heat-receiving side heat sink 32. The multiple fins are arranged in parallel with one another at predetermined intervals inside the cooling water circulating space in such a state that the end faces thereof are in contact with the inner face of the lid. Thus, the heat-receiving side heat sink 32 serves as a water-cooling jacket structure for heat exchange between the fins and the cooling water because the cooling water circulates around the fins inside the cooling water circulating space.

In the water-cooling unit 48, cooling water with heat radiated from the radiator 44 by receiving a blast from the blast fan 49 is introduced into the heat-receiving side heat sink 32 through the circulation pump 46. The cooling water with heat from the heat-radiating side heat sink 29 recovered in the heat-receiving side heat sink 32 is introduced again into the radiator 44. Thus, the heat-receiving side heat sink 32 can cool the heat-radiating side heat sink 29 with a high cooling efficiency.

As illustrated in FIG. 4 and FIG. 5, the electric device 11 includes, inside the device chassis 33, a shutter driving mechanism 50, a lift mechanism 52, an eject mechanism 54, and a control unit 56.

The shutter driving mechanism 50 is a mechanism section configured to drive the shutter member 27 and the shutter member 40 to be opened and closed. The shutter driving mechanism 50 has an unillustrated electric motor, a rack gear or a link member driven by this electric motor to activate the shutter member 40 and a shutter-opening/closing member 58, and the like. The shutter-opening/closing member 58 is a thin plate-like member. The shutter driving mechanism 50 slidingly moves the shutter member 40 to be opened and closed under the control of the control unit 56. Further, the shutter driving mechanism 50 drives the shutter-opening/closing member 58 to rotate so as to open and close the shutter member 27 as well, where the shutter-opening/closing member 58 is inserted in a hole 16b formed in the bottom face 16a of the portable computing device 12 connected to the electric device 11.

The lift mechanism 52 is a mechanism section configured to drive the heat-receiving side heat sink 32 to move up and down. The lift mechanism 52 has an unillustrated electric motor, a guide member driven by this electric motor to lift the heat-receiving side heat sink 32 up and down, and the like. The lift mechanism 52 lifts the heat-receiving side heat sink 32 up and down under the control of the control unit 56. The piping 47 among the heat-receiving side heat sink 32 having the water-cooling jacket structure to be lifted up and down by the lift mechanism 52, the radiator 44, and the circulation pump 46 is made up of flexible hose-like members.

The eject mechanism 54 is a mechanism section configured to drive the engaging lever 30 and the eject member 42 when the portable computing device 12 connected to the electric device 11 is removed. As illustrated in FIG. 4, the eject mechanism 54 has an electric motor 60, a rack gear (driving member) 62, a swinging arm (moving member) 64, and a slide member 66.

The electric motor 60 is such that a worm gear 60a as the output shaft thereof is coupled to the rack gear 62 through a worm wheel 68. The rack gear 62 is provided to be movable in the front and rear direction on the inner face of the device chassis 33, and driven by the worm wheel 68 as a pinion gear to advance and retreat.

The swinging arm 64 is a long arm-like member extending in the right and left direction. The swinging arm 64 is swingable about a pivot shaft 64a provided substantially at the center. The swinging range of the swinging arm 64 is restricted by a stopper 65 (also see FIG. 7A to FIG. 7C). A pressure-receiving part 64b is provided on one end side of the swinging arm 64. The pressure-receiving part 64b is a part pressed by a pressing part 62a provided in a rear-end portion of the rack gear 62. A cushioning mechanism 70, which can transmit and absorb a pressing force from the pressing part 62a, is provided on the pressure-receiving part 64b. When the rack gear 62 moves to the rear side, the swinging arm 64 swings clockwise in FIG. 4, while when the rack gear 62 moves to the front side, the swinging arm 64 swings counterclockwise in FIG. 4. The slide member 66 is coupled to the other end side of the swinging arm 64.

The slide member 66 moves in the front and rear direction along with the swinging of the swinging arm 64. The slide member 66 has an engagement releasing part 66a and a push-up part 66b. The engagement releasing part 66a is a part to move the engaging lever 30 in the releasing direction. The push-up part 66b is a part to push the eject member 42 up by the pressing action of an inclined face, not illustrated. The slide member 66 moves to the front side when the swinging arm 64 swings clockwise. When the slide member 66 moves to the front side, the engagement releasing part 66a moves the engaging lever 30 in the state of being engaged with the engaging hole 31 to release the engaged state, and then the push-up part 66b pushes up the eject member 42. This causes the bottom face 16a of the portable computing device 12 to be pushed up by the eject member 42 and hence the portable computing device 12 to pop up from the placing face 34a.

The control unit 56 performs not only the overall control of the electric device 11 but also the driving control of the water-cooling unit 48, the shutter driving mechanism 50, the lift mechanism 52, and the eject mechanism 54. In response to detection signals of a docking sensor 72 to be turned on and off by the engaging lever 30 and an On sensor 73 to be turned on and off by the bottom face 16a of the portable computing device 12, the control unit 56 controls switching of the electric device 11 from a standby state to an operating state. In the present disclosure, for example, the standby state means a state where the portable computing device 12 is not connected to the electric device 11 so that the detection signal from the docking sensor 72 will be receivable. In this standby state, the water-cooling unit 48, the shutter driving mechanism 50, the lift mechanism 52, and the eject mechanism 54 are in a stopped state. In the present disclosure, for example, the operating state means a state where the portable computing device 12 is connected to the electric device 11 so that cooling operation by the water-cooling unit 48 will be being performed. The operation of each of the shutter driving mechanism 50, the lift mechanism 52, and the eject mechanism 54 is performed in the operating state. Further, in response to a detection signal of an unillustrated removal sensor to be turned on and off by the supporting members 35L and 35R, the control unit 56 controls switching of the electric device 11 from the operating state to the standby state.

The control unit 56 may be implemented in such a manner, for example, that a program is executed by a processor such as a CPU, i.e., in software, implemented in hardware such as an IC (Integrated Circuit), or implemented by using the software and hardware in combination.

Figure 6:
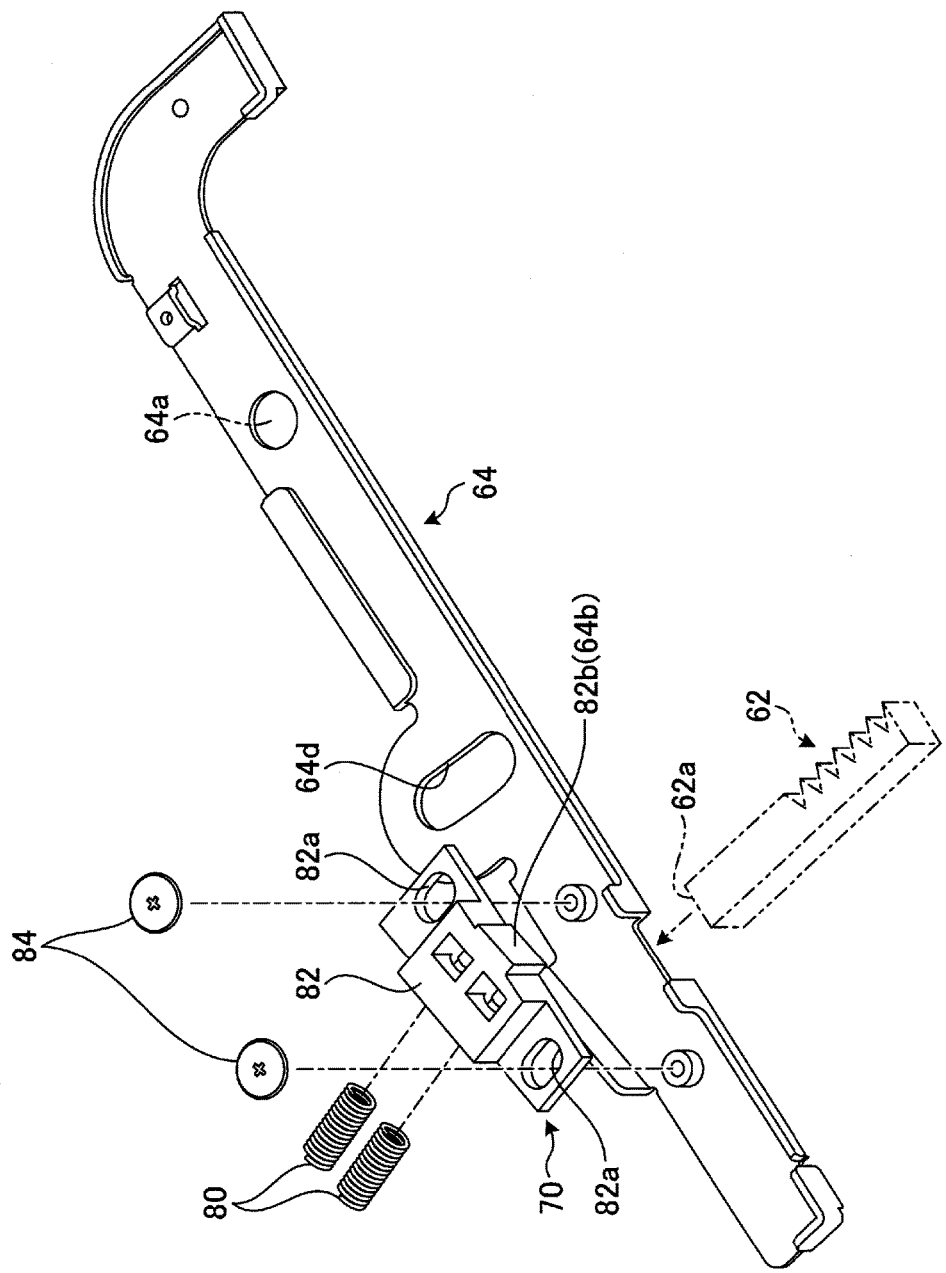
FIG. 6 is an exploded perspective view illustrating a structure example of a cushioning mechanism.
Figure 7A:
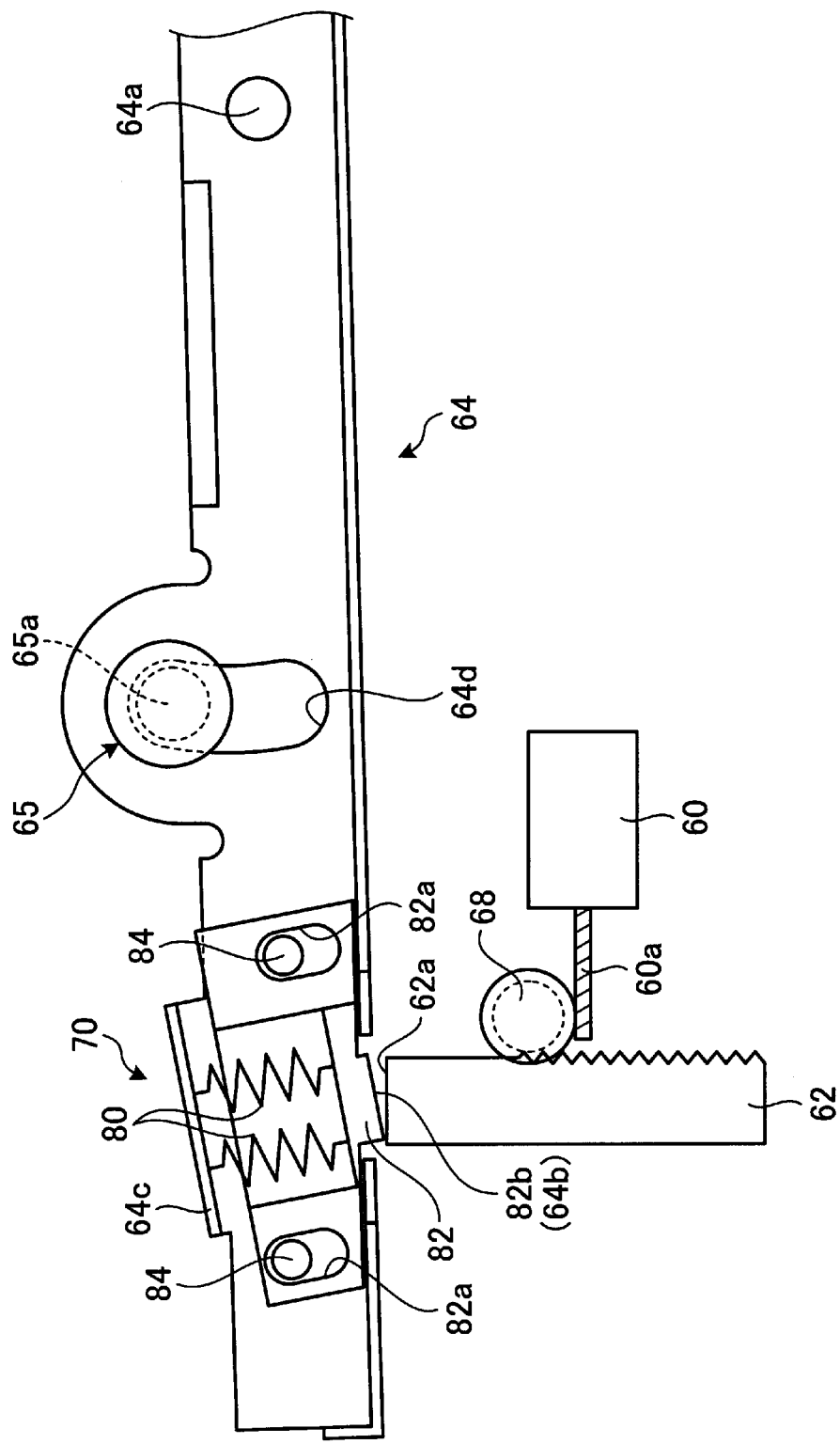
FIG. 7A is a plan view illustrating a state where a pressing force by a rack gear is not applied to a swinging arm.
Figure 7B:
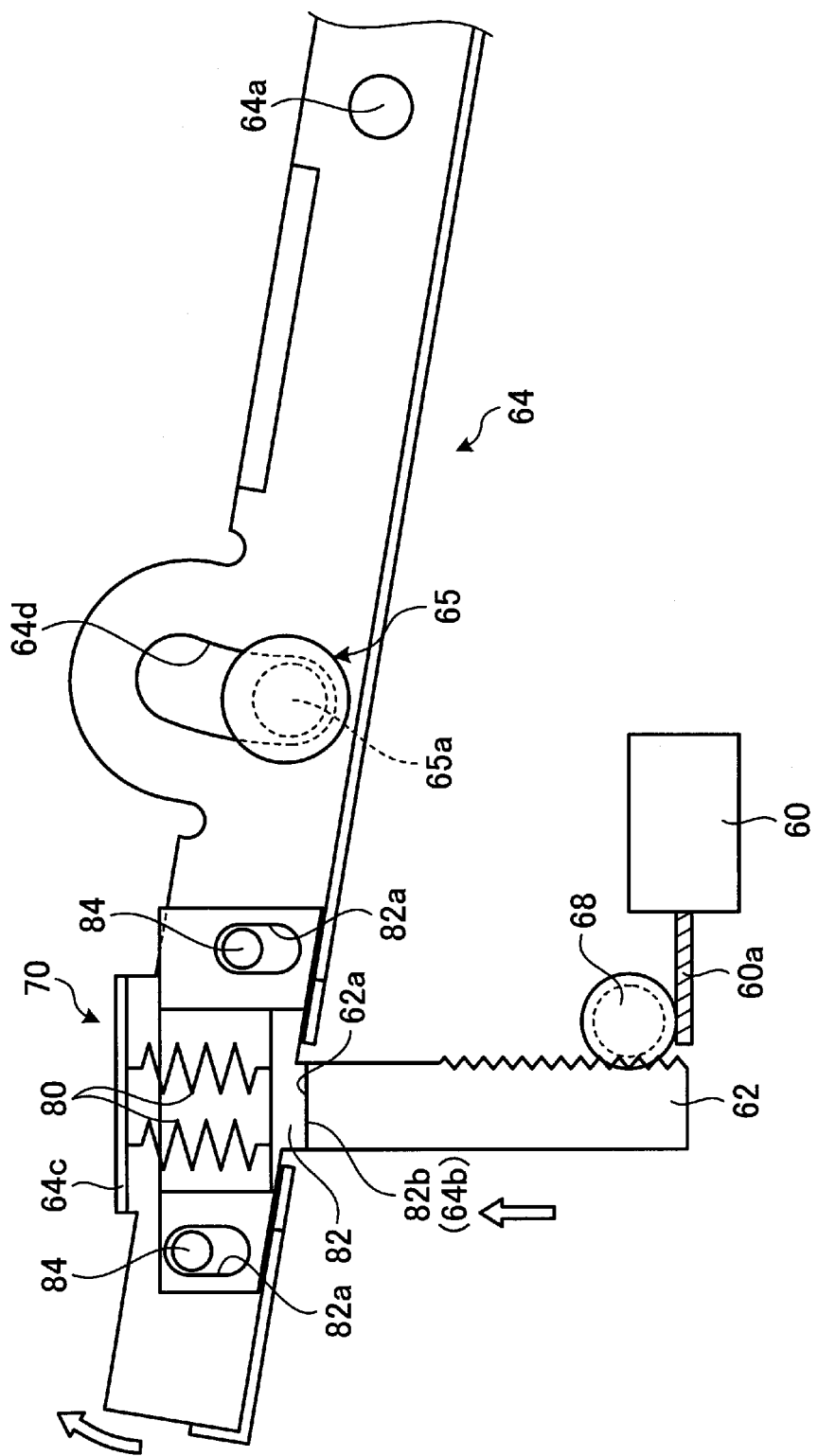
FIG. 7B is a plan view illustrating a state where the rack gear moves rearward from the state illustrated in FIG. 7A to swing the swinging arm.
Figure 7C:
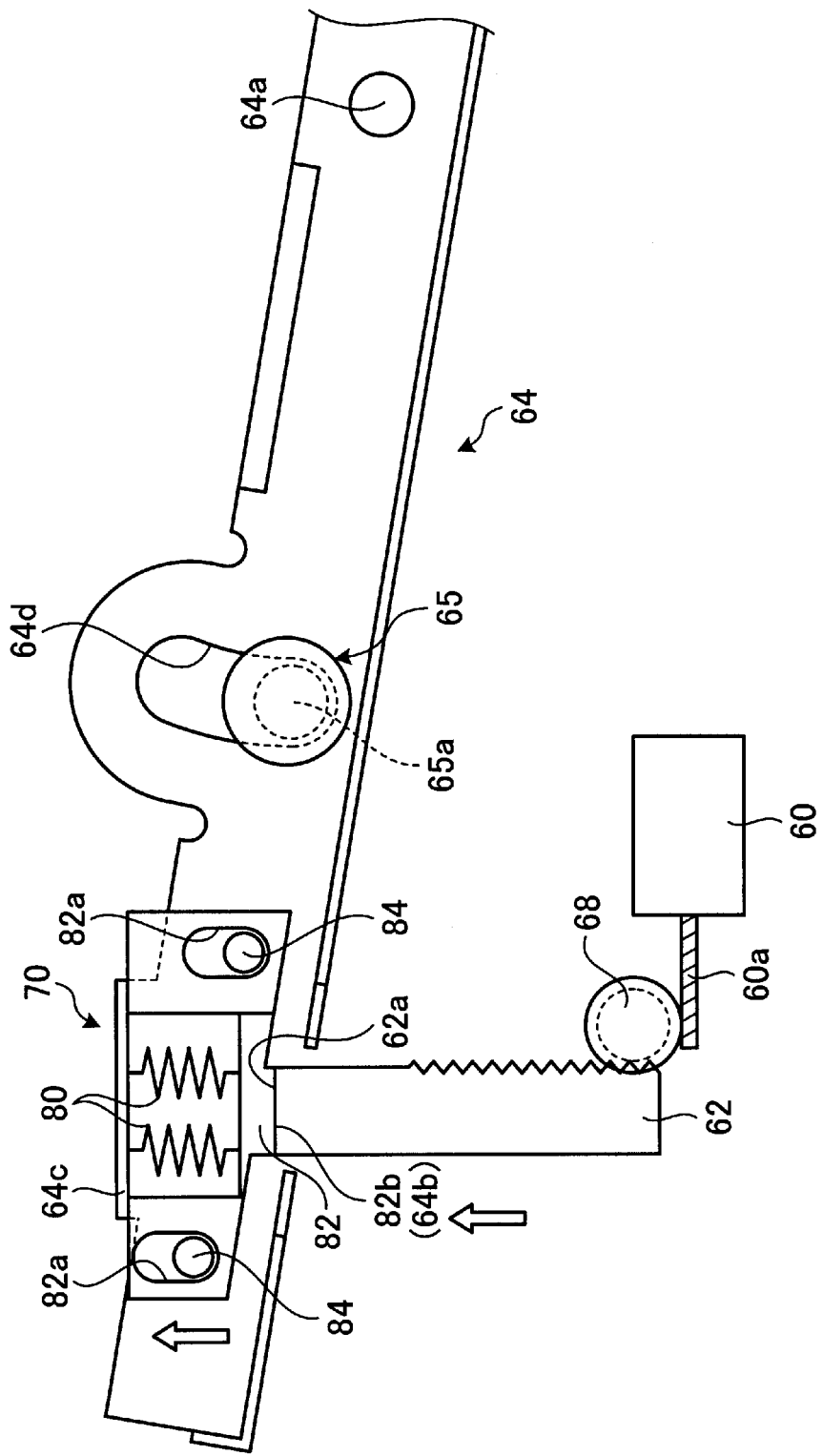
FIG. 7C is a plan view illustrating a state where the movement of the rack gear by the inertial rotation of an electric motor is absorbed by the cushioning mechanism from the state illustrated in FIG. 7B.

FIG. 6 is an exploded perspective view illustrating a structure example of the cushioning mechanism 70. FIG. 7A is a plan view illustrating a state where the pressing force by the rack gear 62 is not applied to the swinging arm 64. FIG. 7B is a plan view illustrating a state where the rack gear 62 moves rearward from the state illustrated in FIG. 7A to swing the swinging arm 64. FIG. 7C is a plan view illustrating a state where the movement of the rack gear 62 by the inertial rotation of the electric motor 60 is absorbed by the cushioning mechanism 70 from the state illustrated in FIG. 7B.

As illustrated in FIG. 6 and FIG. 7A to FIG. 7C, the cushioning mechanism 70 has a contact part 82 elastically supported by two coil springs 80 in a state of being movable relative to the swinging arm 64. Long holes 82a, which are long in the front and rear direction, are provided on both right and left sides of the contact part 82. A guide pin 84 screwed on the swinging arm 64 is inserted into each long hole 82a. The guide pin 84 slides inside the long hole 82a to make the contact part 82 movable relative to the swinging arm 64 within the range of the long hole 82a. One end of each coil spring 80 is supported by a side wall 64c of the swinging arm 64, and the other end thereof is inserted into a hole formed in the chassis of the contact part 82 and supported by the contact part 82. A contact end face 82b of the contact part 82 as a part to come into contact with the pressing part 62a of the rack gear 62 serves as the pressure-receiving part 64b of the swinging arm 64.

The swinging range of the swinging arm 64 is restricted by the stopper 65 provided between the pivot shaft 64a and the cushioning mechanism 70. The stopper 65 is a pin-like member with its shaft part 65a inserted into an arc-like hole 64d formed in the swinging arm 64. The shaft part 65a is inserted into the arc-like hole 64d and fixed to the inner face of the device chassis 33. The shaft part 65a slides inside the arc-like hole 64d to cause the stopper 65 to restrict the swinging range of the swinging arm 64.

As illustrated in FIG. 7A and FIG. 7B, when the rack gear 62 moves rearward to cause the pressing part 62a to press the contact end face 82b (pressure-receiving part 64b) of the contact part 82, the coil springs 80 do not contract until the swinging of the swinging arm 64 is restricted by the stopper 65. Therefore, the pressing force from the rack gear 62 is transmitted to the swinging arm 64 to ensure smooth swinging of the swinging arm 64. On the other hand, as illustrated in FIG. 7B and FIG. 7C, when the rack gear 62 moves rearward after the swinging of the swinging arm 64 is restricted by the stopper 65, the coil springs 80 contract to cause the contact part 82 to move rearward relative to the swinging arm 64. Therefore, the pressing force from the rack gear 62 is absorbed by the cushioning mechanism 70.

The elastic force of the coil springs 80 (the total elastic force of the two coil springs 80 in the present disclosure) to support the contact part 82 elastically with respect to the swinging arm 64 is set larger than a force required to move the swinging arm 64 by the rack gear 62 so as to move the slide member 66 (engaging lever 30). The elastic force of the coil springs 80 is also set smaller than a gear transmission force between the worm wheel 68 as the pinion gear and the rack gear 62.

Next, the operation of the electronic device system 10 will be described.

Figure 8:
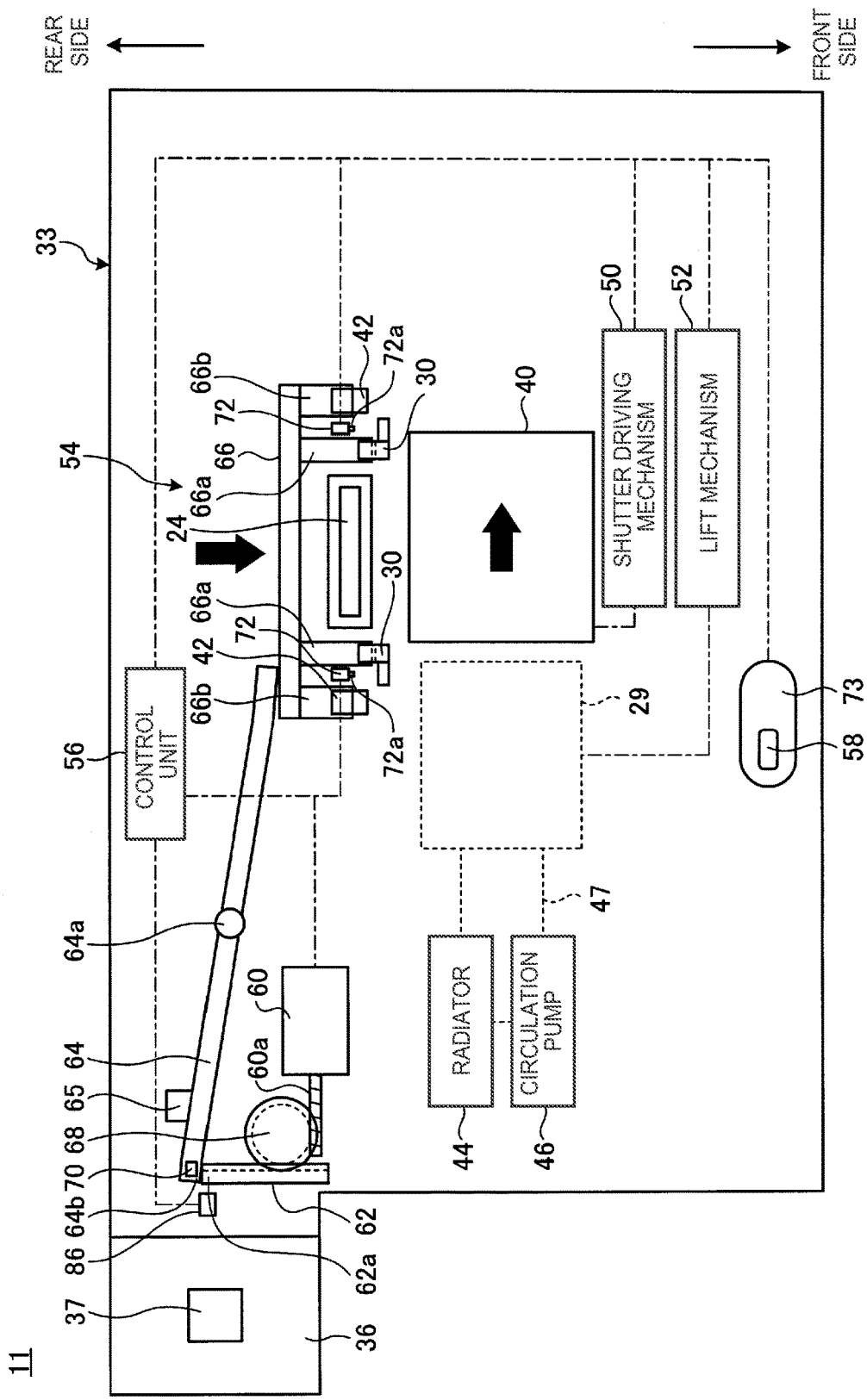
FIG. 8 is a plan view illustrating a state where an eject button is operated from the state illustrated in FIG. 4.

FIG. 8 is a plan view illustrating a state where the eject button 37 is operated from the state illustrated in FIG. 4.

First, when the portable computing device 12 is not docked on the electric device 11, the heat-radiating side heat sink 29 is closed by the shutter member 27 and the heat-receiving side heat sink 32 is closed by the shutter member 40. This prevents a user from touching the heat-radiating side heat sink 29 or the heat-receiving side heat sink 32 by mistake. At this time, the electric device 11 is in the standby state, and the control unit 56 is in a state of waiting for detection signals from the docking sensor 72 and the On sensor 73.

Next, when the portable computing device 12 is docked on the electric device 11 in the standby state, the connector 24 and the connector 25 are connected while inserting each engaging lever 30 of the portable computing device 12 into each engaging hole 31 as illustrated in FIG. 5. Thus, the connector 24 and the connector 25 are electrically connected. Further, the engaging lever 30 is engaged with the engaging hole 31 to prevent the portable computing device 12 from being separated from the electric device 11.

During this docking operation, the top face of the engaging lever 30 slidingly contacts a marginal part of the engaging hole 31 and once moves in a direction opposite to the direction of being engaged with the engaging hole 31 against the biasing force of the lever spring 30a. Then, when the top face climbs over the marginal part of the engaging hole 31, the engaging lever 30 moves in the engaged direction by the biasing force of the lever spring 30a, and is engaged with the engaging hole 31. Therefore, after an Off signal is transmitted from the state where a detection switch 72a of the docking sensor 72 comes into contact with the engaging lever 30 to transmit the On signal, the docking sensor 72 transmits the On signal again. Note that the On sensor 73 is pressed to fall by the bottom face 16a of the portable computing device 12 so as to transmit the On signal.

When receiving the detection signals as the Off signal and the On signal sequentially transmitted from the docking sensor 72, and the detection signal as the On signal from the On sensor 73, the control unit 56 switches the electric device 11 from the standby state to the operating state. The On sensor 73 may be so omitted that the detection from the docking sensor 72 alone will be used to switch the electric device 11 from the standby state to the operating state.

When the electric device 11 is switched to the operating state, the shutter driving mechanism 50 is first activated under the control of the control unit 56 to open the shutter member 27 and the shutter member 40. Next, the lift mechanism 52 is activated to lift up and bring the heat-receiving side heat sink 32 into press contact with the heat-radiating side heat sink 29 so that both will stick fast to each other. After that, the control unit 56 controls the driving of the circulation pump 46 and the blast fan 49 at a predetermined rotational speed. Thus, heat generated by the heating element 43 of the portable computing device 12 is radiated from the radiator 44 to the outside via the heat-radiating side heat sink 29 and the heat-receiving side heat sink 32.

Next, the eject button 37 is activated to perform an undocking operation when the portable computing device 12 is removed from the electric device 11. This undocking operation may be performed by a software input operation using input means such as the keyboard 20 or an unillustrated mouse of the portable computing device 12.

When the undocking operation is performed, the control unit 56 activates the eject mechanism 54 to separate the engaging lever 30 from the engaging hole 31 so as to push up the eject member 42 so that the portable computing device 12 will pop up from the placing face 34a. Thus, the docking state of the portable computing device 12 and the electric device 11 is released.

Specifically, the electric motor 60 is driven to rotate under the control of the control unit 56. As a result, the rack gear 62 moves rearward as illustrated in FIG. 8 through the worm gear 60a and the worm wheel 68. Since the coil spring 80 serves virtually as a rigid body when the contact part 82 of the cushioning mechanism 70 is pressed by the moving rack gear 62, the contact part 82 and the swinging arm 64 come together to cause the swinging arm 64 to swing clockwise as illustrated (see FIG. 7A and FIG. 7B). Thus, the slide member 66 advances and the engaged state of the engaging lever 30 with the engaging hole 31 is released by the engagement releasing part 66a. Subsequently, the eject member 42 is pushed up by the push-up part 66b, and the portable computing device 12 pops up from the placing face 34a to release the docking state on the electric device 11. The swinging arm 64 swings until being restricted by the stopper 65. When the docking state of the electric device 11 and the portable computing device 12 is released, the rack gear 62 is detected by a position detecting sensor 86 and the electric motor 60 is stopped. In other words, the position detecting sensor 86 serves as a sensor for detecting a moving range of the swinging arm 64. After the electric motor 60 is stopped, the swinging arm 64 returns to the original position while pressing the rack gear 62 to move by a biasing force of the lever spring 30a or an unillustrated spring provided in the swinging arm 64.

Note that an electrically driven motor like the electric motor 60 continues rotating by the inertia of the motor itself after the driving is stopped though it is just a short time. In other words, the electric motor 60 continues rotating by its inertia for a given length of time after receiving a stop signal from the control unit 56. Thus, the electric motor 60 continues rotating after the swinging of the swinging arm 64 is restricted by the stopper 65 to cause the rack gear 62 to continue moving. This may cause tooth skipping of the gear pair between the rack gear 62 and the worm wheel 68 as the pinion gear, and hence generate impact noise. To avoid this tooth skipping, the swinging range of the swinging arm 64 can be expanded, but this may be difficult due to installation space constrains and the like.

In contrast, in the present disclosure, the pressing force from the rack gear 62 continuing to move can be absorbed by the cushioning mechanism 70 after the swinging of the swinging arm 64 is restricted by the stopper 65. Specifically, as illustrated in FIG. 7C, when the pressing force from the rack gear 62 by the inertial rotation of the electric motor 60 is applied, the coil springs 80 contract. As a result, the contact part 82 moves until coming into contact with the side wall 64c of the swinging arm 64 to absorb the pressing force from the rack gear 62. Thus, the tooth skipping of the gear pair between the rack gear 62 and the worm wheel 68 as the pinion gear is avoided.

After the portable computing device 12 pops up, the portable computing device 12 is picked up off the placing face 34a. Then, the supporting members 35L and 35R rise as illustrated in FIG. 1, and the removal sensor transmits the Off signal. The control unit 56 activates the lift mechanism 52 to lift down the heat-receiving side heat sink 32 so as to separate it from the heat-radiating side heat sink 29. Subsequently, the control unit 56 activates the shutter driving mechanism 50 to close the shutter member 27 and the shutter member 40. Thus, since the removal of the portable computing device 12 from the electric device 11 is completely finished, the control unit 56 switches the electric device 11 again from the operating state to the standby state.

As described above, the electric device 11 according to the present disclosure includes: the electric motor 60; the rack gear 62 as a driving member which receives a driving force of the electric motor 60 to advance and retreat; the swinging arm 64 as a moving member pressed by the rack gear 62 to move; the stopper 65 which restricts the moving range of the swinging arm 64; and the cushioning mechanism 70 provided on the pressure-receiving part 64b of the swinging arm 64 pressed by the pressing part 62a of the rack gear 62 to transmit the pressing force of the rack gear 62 to the swinging arm 64 so as to move the swinging arm 64 before the movement of the swinging arm 64 is restricted by the stopper 65 and to absorb the pressing force of the rack gear 62 after the movement of the swinging arm 64 is restricted by the stopper 65.

Thus, since the cushioning mechanism 70 does not absorb the pressing force from the rack gear 62 within the swinging range of the swinging arm 64, this pressing force becomes an appropriate moving force of the swinging arm 64. On the other hand, the electric motor 60 continues rotating by its inertia after the driving thereof is stopped so that, even when the rack gear 62 continues moving, the pressing force from the rack gear 62 can be absorbed by the cushioning mechanism 70. This can avoid generating a big load on the rack gear 62 and a driving source (the electric motor 60 and the worm wheel 68) thereof.

The cushioning mechanism 70 may be structured to be placed on the pressing part 62a of the rack gear 62 so that the pressure-receiving part 64b of the swinging arm 64 will be pressed by the contact part 82. In other words, the contact part 82 may be provided to be able to come into contact with the pressure-receiving part 64b of the swinging arm 64 in a state of being movable relative to the rack gear 62 and being elastically supported by the coil spring 80.

In the present disclosure, an elastic force of the coil spring 80 of the cushioning mechanism 70 (the sum of the two coil springs 80 in the present disclosure) is set larger than a force required to move the swinging arm 64 by the rack gear 62 so as to move the slide member 66 in order to move the engaging lever 30 against the biasing force of the lever spring 30a. Further, the elastic force of the coil spring 80 is set smaller than the gear transmission force between the worm wheel 68 as the pinion gear and the rack gear 62. This can move the swinging arm 64 appropriately by the rack gear 62, and further absorb the pressing force from the rack gear 62 appropriately after the swinging of the swinging arm 64 is restricted by the stopper 65.

In the present disclosure, the stopper 65 coming into direct contact with the swinging arm 64 as a stopper that restricts the moving range of the swinging arm 64 as a moving member is exemplified. However, the slide member 66 and the engaging lever 30, which move in response to the movement of the swinging arm 64, can also serve as the stopper to restrict the moving range of the swinging arm 64 without providing such a stopper 65.

In the present disclosure, such a structure that the cushioning mechanism 70 is placed between the rack gear 62 and the swinging arm 64. However, the cushioning mechanism can also be used as various machine mechanisms as long as it is placed between a driving member receiving the driving force of an electric motor to advance and retreat and a moving member pressed by this driving member to move. For example, since the electric motor is also used to activate the shutter driving mechanism 50 and the lift mechanism 52, the cushioning mechanism 70 may also be used to absorb the inertial rotation of this electric motor.

It is needless to say that the present invention is not limited to the above disclosed content, and changes can be made freely without departing from the spirit of the present invention.

We claim:

1. An electric device comprising:
   an electric motor;
   a driving member configured to receive a driving force from the electric motor to advance and retreat;
   a moving member configured to move when pressed by the driving member;
   a stopper configured to restrict a moving range of the moving member; and
   a cushioning mechanism located on a pressure-receiving part of the moving member pressed by a pressing part, configured to transmit a pressing force of the driving member to move the moving member before movement of the moving member is restricted by the stopper, and to absorb the pressing force of the driving member after the movement of the moving member is restricted by the stopper.

2. The electric device according to claim 1, wherein the driving member is a rack gear meshed with a pinion gear rotatably driven by the electric motor.

3. The electric device according to claim 2, wherein the cushioning mechanism comprises a contact part, and
   wherein the contact part comes into contact with the pressure-receiving part of the moving member in an elastically supported state to be movable relative to the driving member.

4. The electric device according to claim 3, further comprising:

a load member configured to be moved by the moving member, wherein the moving member is configured to move by the pressing force of the driving member.

5. The electric device according to claim 4, wherein:

an elastic force of a spring configured to elastically support the contact part of the driving member or the moving member is set at a force larger than required so as to cause the driving member to move the moving member and to move the load member, and a force smaller than a transmission force between the pinion gear and the rack gear.

6. The electric device according to claim 1, further comprising:

a sensor configured to detect the moving range of the moving member; and a control unit configured to receive a detection signal from the sensor and to stop operation of the electric motor.

7. The electric device according to claim 1, further comprising:

an engaging lever capable of being engaged with an engaging hole located in a portable computing device so that the portable computing device can be docked and undocked.

8. The electric device according to claim 7, further comprising:

a lever spring which biases the engaging lever in a direction of being engaged with the engaging hole, wherein when the moving member moves, the engaging lever moves against a biasing force of the lever spring to release a state of being engaged with the engaging hole.

9. The electric device according to claim 8, wherein:

the driving member is a rack gear meshed with a pinion gear rotatably driven by the electric motor, the cushioning mechanism comprises a contact part, and the contact part comes into contact with the pressure-receiving part of the moving member in an elastically supported state to be movable relative to the driving member, and an elastic force of a spring configured to elastically support the contact part of the driving member or the moving member is set at a force larger than required so as to cause the driving member to move the moving member and to move the engaging lever, and a force smaller than a transmission force between the pinion gear and the rack gear.

10. The electric device according to claim 1, further comprising:

a heat-receiving side heat sink thermally connected to a heat-radiating side heat sink with a heating element located internally in a portable computing device to absorb heat of the heating element.

11. The electric device according to claim 10, further comprising:

a water-cooling unit connected to a radiator, the heat-receiving side heat sink, and a circulation pump through piping to circulate cooling water.

12. An electronic device system comprising:

a portable computing device; and an electric device to which the portable computing device is removably attached, wherein the electric device comprises an electric motor;

a driving member configured to receive a driving force from the electric motor to advance and retreat;

a moving member configured to move when pressed by the driving member;

a stopper configured to restrict a moving range of the moving member; and a cushioning mechanism located on a pressure-receiving part of the moving member pressed by a pressing part, configured to transmit a pressing force of the driving member to move the moving member before movement of the moving member is restricted by the stopper, and to absorb the pressing force of the driving member after the movement of the moving member is restricted by the stopper.

13. The electronic device system according to claim 12, wherein:

the portable computing device comprises a heating element, a heat-radiating side heat sink thermally connected to the heating element, and the electric device comprises a heat-receiving side heat sink thermally connected to the heat-radiating side heat sink to absorb heat of the heating element.

* * * * *